United States Patent [19]  [11] Patent Number: 4,782,007
Ferrier  [45] Date of Patent: Nov. 1, 1988

[54] ADDITIVE METHOD FOR MANUFACTURING PRINTED CIRCUIT BOARDS USING AQUEOUS ALKALINE DEVELOPABLE AND STRIPPABLE PHOTORESISTS

[75] Inventor: Donald R. Ferrier, Thomaston, Conn.

[73] Assignee: MacDermid, Incorporated, Waterbury, Conn.

[21] Appl. No.: 43,325

[22] Filed: Apr. 28, 1987

[51] Int. Cl.$^4$ .......... B05D 5/12; B05D 3/04; B05D 3/10
[52] U.S. Cl. .................. 430/313; 430/314; 430/319; 427/98; 427/304; 427/306; 427/307
[58] Field of Search .............. 427/98, 304, 306, 307; 430/314, 313, 319

[56] References Cited

U.S. PATENT DOCUMENTS

| | | | |
|---|---|---|---|
| 4,217,182 | 8/1980 | Cross | 427/306 |
| 4,264,646 | 4/1981 | Thornburg et al. | 427/98 |
| 4,388,351 | 6/1983 | Sawyer | 427/304 |
| 4,551,488 | 11/1985 | Leech et al. | 428/901 |
| 4,574,031 | 3/1986 | Dorey, II et al. | 427/304 |
| 4,666,739 | 5/1987 | Roubal | 427/98 |

Primary Examiner—Norman Morgenstern
Assistant Examiner—M. Burke
Attorney, Agent, or Firm—St. Onge Steward Johnston & Reens

[57] ABSTRACT

An additive process for making printed circuit boards utilizing aqueous alkaline strippable resists, in which a suitable insulating substrate is patterned with the resist, the resist-patterned substrate catalyzed to electroless metal deposition, the resist then stripped completely from the substrate, utilizing an aqueous alkaline solution, preferably containing a reducing agent, and the electroless metal then deposited over the areas of the substrate catalyzed in the desired pattern.

5 Claims, No Drawings

ADDITIVE METHOD FOR MANUFACTURING PRINTED CIRCUIT BOARDS USING AQUEOUS ALKALINE DEVELOPABLE AND STRIPPABLE PHOTORESISTS

BACKGROUND OF THE INVENTION

The present invention relates to the manufacture of printed circuitboards and, more particularly, to an improved additive manufacturing sequence for producing printed circuits utilizing aqueous alkaline strippable resists.

In the manufacture of printed circuit boards, it is now commonplace to produce printed circuitry on both sides of a planar rigid or flexible insulating substrate. Of further importance is the manufacture of multilayer printed circuits. In these products, the board consists of parallel, planar, alternating inner layers of insulating substrate material and conductive metal. The exposed outer sides of the laminated structure are provided with circuit patterns as with double-sided boards, and the metal inner layers may themselves contain circuit patterns.

In double-sided and multilayer printed circuit boards, it is necessary to provide conductive interconnection between or among the various layers or sides of the board containing conductive circuitry. This is commonly achieved by providing metallized, conductive thru-holes in the board communicating with the sides and layers requiring electrical interconnection. Typically, thru-holes are drilled or punched through the board structure at desired locations. The thus exposed hole surfaces, consisting partly or entirely of insulating material, are then metallized, generally by utilization of electroless metal depositing techniques.

In terms of providing the desired circuit pattern on the board, the art has developed a variety of manufacturing sequences, many of which fall into the broad categories of "subtractive" or "additive" techniques. Common to subtractive processes is the need to etch away (or subtract) metal to expose substrate surface in areas where no circuitry is desired. Accordingly, some disadvantages associated with subtractive processes include the necessity of using relatively large quantities of etching solutions, possible undesired undercutting of metal in areas where metal is supposed to remain, and waste of base metal (or need for processes to reclaim base metal).

Additive processes, on the other hand, begin with bare substrate surfaces and build up metallization in desired areas on such surfaces, the desired areas being those not masked by a previously-applied pattern of plating resist material (e.g., photoresist in negative pattern). While avoiding the problems associated with the etching required in subtractive processes, additive processes are not without their own inherent difficulties in terms of the choice of resist materials and the ability to build up to the desired full metallization by electroless methods.

In one additive technique known in the art, the insulating substrate surfaces are first sensitized and activated to form a blanket catalyzed layer thereon. Next, the appropriate resist pattern is formed over the catalyzed layer so as to leave exposed the areas where metallization is desired. Thereafter, the substrate is treated in an electroless metal depositing solution to effect metallization only of the catalyzed and exposed desired areas. In this process, however, it is necessary after removal of the resist to etch away the catalytic layer which was under the resist so as to prevent excessively low surface resistivity between metallized areas on the substrate due to the catalytic layer.

In another proposed additive technique, a negative pattern of resist is first applied to the substrate surfaces. All surfaces (including resist surfaces) are then sensitized and activated, followed by treatment of the surfaces with an electroless metal depositing solution, resulting in deposit of metal on all surfaces. The resist is then stripped from the substrate surface, carrying along with it the metal deposited thereon, and thus leaving behind the built up metallized pattern. In this process, however, the deposition of metal over the resist is quite substantial and leads to difficulties in cleanly stripping the resist, often resulting in the remaining metallized areas adjacent the resist (e.g., conductors) having ragged edges or slivers, correspondingly poor fine line resolution or definition, and risk of shorting.

U.S. Pat. No. 4,388,351 to Sawyer sought to improve upon the foregoing by depositing over all surfaces (including resist surfaces) only a thin flash layer of electroless metal, followed by stripping of the resist and electroless build up to full desired metallization on the patterned metal flash surfaces remaining. In processes of this type, the degree or extent of flash plating must be controlled within relatively narrow limits. On the one hand, sufficient thickness is required in order for the flash plate to serve its intended purpose as a defined base upon which further metallization can be built up in the required pattern after resist removal. However, if the flash deposit is too thick, stripping of the resist is quite difficult and may lead to the existence of ragged edges or metal slivers or whiskers in flash plated areas adjacent to where the resist existed. In practice, it has proven to be quite difficult to strike a proper balance within the narrow confines of the process. Particular difficulty also is found with respect to thru-hole coverage. In those cases where the flash plate is sufficiently thin so as not to interfere with resist removal, thru-hole coverage by metal is poor; but when the process is arranged so as to provide better thru-hole coverage, the increased thickness and/or tenacity of the layer plated on the resist interferes with resist removal.

Another difficulty with the Sawyer process is that it is conducted utilizing photoresists or inks of the type which require hydrocarbon solvents for developing (for photoresists) and for stripping. Such solvents can pose difficult environmental and health problems. In U.S. Pat. No. 4,574,031, Dorey II, et al. addressed this problem in describing a Sawyer-like process based upon aqueous alkaline developable/strippable photoresists. Owing to the strippable nature of the resist, however, it was necessary for Dorey II, et al. to further modify the Sawyer process so as to avoid contact of the resist with aqueous solutions of pH greater than about 10 until such time as resist stripping was desired. Thus, for example, the electroless plating solutions employed in the process to produce the flash plate over all board surfaces (including over resist surfaces) were required to be of the type operating at a pH of less than about 10 in order to avoid stripping the resist during the flash plate operation. Although plating solutions of this type are known and available, such as the hypophosphite-reduced, formaldehyde-free electroless copper solutions described in, e.g., U.S. Pat. No. 4,209,331 and sold by MacDermid, Inc. of Waterbury, Connecticut under the designation 249-T, they tend to be more expensive than conventional highly-alkaline formaldehyde-based electroless baths. Moreover, it is found that certain electroless plating baths, even of appropriate pH for use in a process such as this, nevertheless result in deposit of a flash layer which adheres so tenaciously to the resist surfaces as to render clean resist removal extremely difficult.

Thus, the process of Dorey II, et al. has associated with it not only the previously-discussed problems inherent in processes of the Sawyer-type regarding attainment of the proper balance between sufficient and insufficient thickness and/or tenacity of the flash layer, difficulty in resist stripping, the leaving of slivers or whiskers after stripping, and the like, but also tends to make the overall process more expensive than desired and limits one to choice from only a few potentially suitable plating baths.

SUMMARY OF THE INVENTION

It is an object of the present invention to provide an additive process for the manufacture of printed circuit boards.

A further more specific object of the invention is to provide an additive process for the manufacture of printed circuit boards utilizing aqueous alkaline strippable resists.

Yet a further more specific object of the invention is to provide an additive process of the type above-described which can be conducted within a wide range of operable conditions and which can utilize economical plating compositions.

These and other objects are attained by the provision of an additive process in which an aqueous alkaline strippable resist is applied to a circuit board substrate surface to delineate thereon a desired final pattern for metallized areas; thereafter contacting the substrate surfaces with a solution or the like which results in deposit on such surfaces of species, or precursors thereof, catalytic to electroless metal deposition; thereafter treating the substrate surfaces with an aqueous alkaline solution to strip from such surfaces applied resist and, hence, catalytic species or precursors present on such applied resist; and thereafter contacting the substrate surfaces with an electroless depositing solution to deposit metal on the catalyzed, patterned surfaces of the substrate.

As is apparent, the additive process of the present invention avoids the disadvantages of processes of the Sawyer and Dorey II, et al. type since there is no plating, flash or otherwise, over the resist surfaces. Thus, no problems exist as to difficulty in resist removal, or the leaving behind of metal slivers or whiskers, or the need for precise control over flash plate thickness. Moreover, the inventive process constitutes yet a further improvement over the Dorey II, et al. process since it enables the use of aqueous alkaline strippable resists without at the same time limiting the type of electroless plating compositions which can be employed. Indeed, as a consequence of the present invention, it is possible to employ any number of conventional electroless depositing solutions to achieve the full build of metallization desired, in a single or multiple steps, including autocatalytic copper or nickel depositing solutions otherwise unusable with a Dorey II, et al. type process.

In accordance with preferred aspects of the invention, the aqueous alkaline strippable resist used to pattern the substrate is one which results from application to the substrate of a layer of photosensitive material, exposure of the layer to light through a mask, and development of the exposed layer so as to leave on the substrate resist in the appropriate pattern (hereinafter referred to as an "aqueous alkaline developable and strippable photoresist").

In a particularly preferred embodiment of the invention, the aqueous alkaline solution utilized to strip the resist from the substrate contains a reducing agent.

DETAILED DESCRIPTION OF THE INVENTION

Generally, the process of the present invention involves an initial step of application of an aqueous alkaline strippable resist to a substrate suitable for manufacture of a printed circuit board.

Suitable substrates for use in the present invention include any rigid or flexible insulating organic or inorganic material such as resins, glass, ceramics and the like. For manufacture of printed circuits, typical substrate materials are insulating thermosetting resins, thermoplastic resins, and mixtures thereof, including fiber, e.g., fiberglass, impregnated variations of the foregoing.

Included in the thermoplastic resins are acetyl resins; acrylics, such as methacrylate; cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile-styrene copolymers and acrylonitrilebutadiene styrene copolymers; polycarbonates; polychlorotriflouroethylene; and vinyl polymers and copolymers, such as vinyl acetate vinyl alcohol, vinyl butyral, vinyl chroride, vinyl chloride acetate copolymer, vinylidene chloride and vinyl formal.

Among the thermosetting resins may be mentioned allyl phthalate; furane; melamine formaldehyde; phenol formaldehyde; and phenol furfural copolymers, alone or compounded with butadiene acrylonitrile copolymers or acrylonitrile-butadiene styrene copolymers; polyacrylic esters; silicones; urea formaldehyde; epoxy resins; allyl resins; glycerol phthalates; polyesters; and the like.

The substrates may also comprise porous materials and fibers which have been impregnated with resins. The invention is particularly applicable to metallization of resinimpregnated fiber structures and varnish coated resinimpregnated fiber structures of the type described. A preferred substrate is a glass reinforced epoxy substrate commercially available as NEMA grade FR-4 such as available from NVF Corporation, EG-873-2102; Synthane Taylor FE-G20 and Norplex G10-FRA. Polyimide type substrates are also suitable.

After a substrate has been selected, through-holes are drilled or punched therein and, as usually is necessary or prudent, the substrate is cleaned in preparation for further processing.

In the next step of the process of the invention, an aqueous alkaline strippable resist (i.e., a resist capable of being removed from the substrate with aqueous alkaline media) is applied to the substrate in a pattern which defines (by those areas not covered by the resist) the desired pattern to be metallized (including thru-hole surfaces). In general, the resist can be applied utilizing photosensitive or non-photosensitive compositions. Thus, for example, the resist pattern can be achieved directly by application to the substrate, through an appropriate stencil or screen, of a fluid composition (e.g., an ink) which can then be hardened in place by heating to form the desired resist pattern. More preferred, however, is the utilization of photosensitive compositions which are applied as a generally unpatterned layer on the substrate. The layer is then exposed to light of appropriate wavelength through a suitable mask in a desired pattern, and, depending upon whether negative-working or positive-working resists are employed, the exposure results in selective cross-linking or solubilization permitting either unexposed or exposed areas being capable of being dissolved away with a suitable developer. After development, there remains on the substrate a pattern of resist which defines (by those areas not covered by resist) the desired areas to be metallized. Among the photoresists which can be developed in aqueous alkaline medium and eventually stripped in aqueous alkaline medium are liquid type photoresists (e.g., Accutrac TM photoresists #2314 and #2491 available from W. R. Grace) or dry film photoresists (e.g., Riston 3600, available from E. I. du Pont de Nemours & Co.), with the liquid type being preferred. The photoresist is uniformly applied to the substrate surfaces as by spraying, roller coating, coating through a screen, or the like, and is then imaged and developed, as well known in the art, to form a desired positive pattern of exposed substrate where metallization in the final board is desired. If desired, the patterned resist can be subsequently treated (e.g., further exposed to radiation if the resist is the type which cross-links and hardens under such conditions) to improve its resistance to other chemicals or compositions encountered in the process prior to stripping of the resist.

Generally, the substrate masked with photoresist will then be treated with swelling and etching solutions to form micropores therein which aid in achieving good adherence of eventual metal deposit to the substrate surface. Typically, for the commonly employed epoxy-glass substrates (commercially known as FR-4 panels), with or without further rubber modified epoxy coatings thereon, the swellant will be a dimethylformamide solution heated somewhat above room temperature. After water rinsing, the substrate can be treated with a chromic acid/sulfuric acid etching solution, rinsed again, and treated with a solution to remove chromium ions or reduce them to the $+3$ valence state, as for example by use of sodium metabisulfite or hydrazine, so long as such solutions are employed at a pH sufficiently low (e.g., pH 10 or less) so as not to dissolve or strip the resist material.

Following a further water rinsing (sometimes preceded by treatment with acid to insure compatibility of the surface with subsequently-applied catalyst), the resist-patterned substrate can optionally be treated with a conditioner to improve catalyst and metal coverage on thru-hole surfaces. The next essential step in the process is treatment of the resist-patterned substrate with a solution or the like which deposits species catalytic to electroless deposition, or precursors of such species, on the surfaces (especially the exposed substrate surfaces, including thru-hole surfaces, but catalyst also will become absorbed to certain degrees on the resist surfaces). Typically, the solution will be of the one-step type, as described for example in U.S. Pat. Nos. 3,011,920 and 3,532,518, involving true or colloidal sols or solutions of palladium and tin compounds, and commercially available as, e.g., Mactivate 10 from MacDermid, Inc. This one step activation process usually is followed by an acceleration step (which, in the process of this invention, can be delayed until after resist stripping) which functions either to remove excess tin deposits or alter the valence of the tin compounds or some other mechanism to stabilize the catalyst on the substrate surface and insure its exposure in the subsequent electroless metallization. Where an acceleration step is employed, particularly preferred is the use of an oxidizing accelerator as described in U.S. Pat. No. 4,608,275 to Kukanskis, et al. One-step catalysts also are known which do not require acceleration, such as the organic acid-containing compositions described in Canadian Patent No. 1,199,754 of Rhodenizer.

Following the deposition of catalyst, the resist is stripped from the substrate utilizing an aqueous alkaline solution of appropriate pH, e.g., a pH of about 10 or greater. Typically a sodium hydroxide solution will be employed. The concentration of alkali in the stripping solution and the pH of the solution may vary depending upon particular resists employed, the alkaline material in the solution, and other like factors. While there is no particular criticality known with respect to these parameters, it will be apparent that the conditions employed during the stripping operation (e.g., time, temperature, alkali concentration, pH) must be sufficient to remove resist from the substrate while at the same time not being so highly aggressive as to risk extensive removal of catalyst from non-resist areas on the substrate.

In the stripping operation it generally is found that only relatively minor, if any, removal of catalyst on non-resist substrate surfaces occurs, and not so much as to significantly affect the subsequent electroless deposition. However, it has proven useful (and is the preferred embodiment of this invention) to include in the stripping solution a reducing agent, such as hydrazine, alkali hypophosphite, sodium borohydride, dimethyl amino borane, or other like reducing agent, which appears to have the effect of improving the subsequent electroless deposit on the catalyzed substrate areas either by minimizing removal of catalyst during stripping or stabilizing the catalyst or exposing additional catalytic surface. The concentration of reducing agent in the stripping solution will, of course, vary depending upon the particular reducing agent employed, but in all cases will be sufficient to achieve the above-noted effects, i.e., retention during the stripping operation of sufficient catalyst on non-resist areas to promote effective metallization on desired areas in the subsequent plating steps.

The stripping step may also serve in certain instances as the method by which the acceleration of previously-applied catalyst is attained for those catalyst systems requiring acceleration.

Following stripping of the resist, the substrate, now catalyzed in the desired pattern, is contacted with any suitable electroless metal depositing bath to metallize the catalyzed areas. Since no resist is present, no particular concern or limitation exists regarding the type or operating pH of the plating bath. The full thickness of metallization desired in the final circuit board can either be provided in a single plating step utilizing an appropriate bath or, alternatively, can be provided in a series of steps, such as by application of a first flash or strike of metal from a first electroless depositing bath, followed by further plating in a different bath to achieve the full build desired. Particularly preferred by reason of cost and autocatalytic nature are formaldehyde-reduced electroless copper baths as available for example, as MacuDep 20 or MacuDep 52 or MacuDep 9650 from MacDermid, Inc., as well as electroless nickel baths based either on dimethyl aminoborane reducing agents or formaldehyde or hypophosphite.

The process of the invention is further illustrated with reference to the following examples.

EXAMPLE I

A glass-filled epoxy substrate panel containing thru-holes was coated with W. R. Grace 3000 resist, imaged and developed to provide a resist pattern, and the resist pattern then further hardened by additional irradiation. The panel was then treated with a swelling agent (dimethylformamide), followed by a chromic acid etch, rinsing and neutralization with sodium bisulfite. The panel was then treated with a conditioner to enhance thru-hole plating, and, after rinsing, was activated (catalyzed) using a colloidal palladium-tin catalyst sold as Mactivate 10 by MacDermid, Inc. Following activation, the resist was stripped from the panel by immersing it for ten (10) minutes in a 3N solution of sodium hydroxide containing 0.25% by volume hydrazine hydrate (85%). The panel was rinsed thoroughly and immersed in an electroless copper, formaldehyde-reduced plating bath (MacuDep 52, MacDermid, Inc.) for fifteen (15) minutes to provide a copper strike on the catalyzed areas. The panel was then rinsed, baked and activated in 5% sulfuric acid (1 min.) followed by immersion in an electroless, formaldehyde-reduced copper depositing bath (MacuDep 9650, MacDermid, Inc.) for sixteen (16) hours to achieve a full-build of copper over the strike coating. Copper coverage on panel surfaces and in thru-holes was good.

EXAMPLE II

The process of Example I was repeated with the exceptions that (a) in place of the hydrazine hydrate, the sodium hydroxide stripping solution contained 8 g/l of sodium hypophosphite, and (b) the electroless, formaldehyde-reduced copper plating bath used to provide the initial copper metallization was MacuDep 20 (MacDermid, Inc.). All other conditions and materials were identical. Copper coverage was excellent.

EXAMPLE III

The process of Example II was repeated with the exceptions that (a) thru-hole conditioner was eliminated, and (b) following resist stripping, the panel was immersed in an alkaline accelerator for the catalyst, containing sodium chlorite, according to U.S. Pat. No. 4,608,275. Similar excellent results were obtained.

While the invention has been described with respect to certain preferred embodiments and conditions, these are intended to be merely illustrative of the wide variety of such possible variations within the scope of the invention, as defined by the appended claims.

What is claimed is:

1. A process for manufacturing a pattern-metallized printed circuit by additive processing, comprising the steps of:
   (a) providing an insulating substrate;
   (b) providing on the surfaces of said substrate an alkaline strippable plating resist in a pattern which defines those areas on the surfaces of said substrate where metallization is not desired;
   (c) depositing on the resist-patterned substrate species or precursors thereof catalytic to electroless metallization;
   (d) removing said resist, and any catalytic species or precursors thereon, from said substrate by contact thereof with an aqueous alkaline solution containing a reducing agent; and
   (e) electrolessly depositing metal on the remaining catalyzed areas of said substrate.

2. The process according to claim 1 wherein said alkaline strippable resist is provided by coating the substrate with a photosensitive resist material, exposing said coated substrate to light through a mask of desired pattern, and developing said exposed coated substrate so as to leave on the surfaces of said substrate an alkaline strippable plating resist in the desired pattern.

3. The process according to claim 2 wherein, prior to provision of said resist on said substrate, said substrate has thru-holes punched or drilled therein, and wherein said electroless deposition of metal is effective to metallize the surfaces of said thru-holes.

4. The process according to claim 1 wherein, prior to the depositing of catalytic species or precursors thereof on said substrate, said resist-patterned substrate is sequentially contacted with a swellant solution and an etchant solution.

5. The process according to claim 1 wherein said electroless depositing of metal on the remaining catalyzed areas of said substrate is effected by immersion of said substrate in a formaldehyde-reduced electroless copper depositing solution.

* * * * *